US 11,626,362 B2

(12) United States Patent
Cho et al.

(10) Patent No.: US 11,626,362 B2
(45) Date of Patent: *Apr. 11, 2023

(54) SEMICONDUCTOR PACKAGE

(71) Applicant: SAMSUNG ELECTRONICS CO., LTD., Suwon-si (KR)

(72) Inventors: Junghyun Cho, Suwon-si (KR); Youngsik Hur, Suwon-si (KR); Youngkwan Lee, Suwon-si (KR); Jongrok Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 85 days.

This patent is subject to a terminal disclaimer.

(21) Appl. No.: 17/333,615

(22) Filed: May 28, 2021

(65) Prior Publication Data

US 2021/0296222 A1    Sep. 23, 2021

Related U.S. Application Data

(63) Continuation of application No. 16/723,455, filed on Dec. 20, 2019, now Pat. No. 11,031,328.

(30) Foreign Application Priority Data

Mar. 4, 2019  (KR) .................. 10-2019-0024733

(51) Int. Cl.
*H01L 23/498* (2006.01)
*H01L 23/00* (2006.01)
*H01L 23/31* (2006.01)

(52) U.S. Cl.
CPC .... *H01L 23/49827* (2013.01); *H01L 23/3121* (2013.01); *H01L 23/49811* (2013.01);
(Continued)

(58) Field of Classification Search
CPC ......... H01L 23/49827; H01L 23/49861; H01L 24/45; H01L 23/3121; H01L 23/49894;
(Continued)

(56) References Cited

U.S. PATENT DOCUMENTS 6,952,049 B1 * 10/2005 Ogawa .................. H01L 23/642
257/700
10,340,245 B2    7/2019 Seol et al.
(Continued)

FOREIGN PATENT DOCUMENTS

| JP | 2004-95854 A | 3/2004 |
|---|---|---|
| KR | 10-2015-0022204 A | 3/2015 |
| KR | 10-2018-0064743 A | 6/2018 |

*Primary Examiner* — Victor A Mandala
(74) *Attorney, Agent, or Firm* — Sughrue Mion, PLLC

(57) ABSTRACT

A method of manufacturing a semiconductor package includes preparing a core substrate having an upper surface and a lower surface, and including a cavity. A passive component is disposed in the cavity. A first insulating layer is formed on the upper surface of the core substrate and in the cavity and encapsulates the passive component. Through-vias are formed that penetrate the core substrate and the first insulating layer, and a first wiring layer is formed on the first insulating layer. The first wiring layer connects the through-vias and the passive component. A connection structure including an insulating member is formed on the first insulating layer and a redistribution layer is formed in the insulating member. The redistribution layer is connected to the first wiring layer. A semiconductor chip is disposed on an upper surface of the connection structure. The semiconductor chip has connection pads connected to the redistribution layer.

20 Claims, 9 Drawing Sheets

(52) U.S. Cl.
CPC .. *H01L 23/49861* (2013.01); *H01L 23/49894* (2013.01); *H01L 24/45* (2013.01)

(58) Field of Classification Search
CPC ..... H01L 23/49811; H01L 2221/68345; H01L 21/6836; H01L 25/00; H01L 23/3128
See application file for complete search history.

(56) References Cited

U.S. PATENT DOCUMENTS

| | | | |
|---|---|---|---|
| 10,410,961 B2 | 9/2019 | Lee et al. | |
| 11,031,328 B2* | 6/2021 | Cho | H01L 23/49894 |
| 11,205,604 B2* | 12/2021 | Kim | H01L 23/36 |
| 2013/0221518 A1* | 8/2013 | Ishida | H05K 1/0271 |
| | | | 257/737 |
| 2013/0285254 A1* | 10/2013 | Kainuma | H01L 24/24 |
| | | | 257/774 |
| 2014/0048906 A1* | 2/2014 | Shim | H01L 21/565 |
| | | | 257/532 |
| 2014/0185258 A1* | 7/2014 | Lee | H01L 23/49822 |
| | | | 361/761 |
| 2014/0252573 A1* | 9/2014 | Lin | H01L 23/5389 |
| | | | 438/123 |
| 2015/0055312 A1 | 2/2015 | Lee et al. | |
| 2017/0133309 A1* | 5/2017 | Kim | H01L 24/19 |
| 2017/0228529 A1* | 8/2017 | Huang | H01L 25/50 |
| 2017/0309558 A1* | 10/2017 | Kajihara | H01L 23/49894 |
| 2018/0042115 A1* | 2/2018 | Sato | H01L 21/486 |
| 2018/0098430 A1* | 4/2018 | Sato | H01L 21/4857 |
| 2018/0158791 A1* | 6/2018 | Seol | H01L 24/16 |
| 2019/0131232 A1* | 5/2019 | Lee | H01L 25/0655 |
| 2019/0131241 A1* | 5/2019 | Jeng | H01L 25/105 |
| 2019/0139853 A1* | 5/2019 | Oh | H01L 23/562 |
| 2019/0163945 A1* | 5/2019 | Kim | G06V 40/1306 |
| 2019/0164895 A1* | 5/2019 | Kim | H01L 23/552 |
| 2019/0173195 A1* | 6/2019 | Kim | H01Q 21/065 |
| 2019/0229047 A1* | 7/2019 | Moon | H01L 24/19 |
| 2020/0075487 A1* | 3/2020 | Shin | H01L 23/3128 |
| 2020/0105703 A1* | 4/2020 | Kim | H01L 23/13 |
| 2020/0152569 A1* | 5/2020 | Lee | H01L 23/5283 |
| 2020/0343220 A1* | 10/2020 | Chen | H01L 25/0652 |
| 2022/0246579 A1* | 8/2022 | Chen | H01L 24/92 |

* cited by examiner

SEMICONDUCTOR PACKAGE

CROSS-REFERENCE TO RELATED APPLICATION(S)

This application is a continuation application of U.S. application Ser. No. 16/723,455, filed Dec. 20, 2019, which claims benefit of priority to Korean Patent Application No. 10-2019-0024733 filed on Mar. 4, 2019 in the Korean Intellectual Property Office, the disclosures of each of which are incorporated by reference herein in their entireties.

TECHNICAL FIELD

The present disclosure relates to a hybrid interposer and a semiconductor package including the same.

BACKGROUND

In accordance with improvement of specifications of a set and use of a high bandwidth memory (HBM), an interposer market has grown. Currently, silicon has been mainly used as a material of the interposer, but development of a glass or organic formation process has been conducted in order to increase an area and reduce a cost.

In a high performance semiconductor package, a passive component such as a capacitor needs to be disposed in a region adjacent to a semiconductor chip in order to improve power noise and a power integrity due to generation of a parasitic inductance.

SUMMARY

An aspect of the present disclosure may provide a hybrid interposer in which a passive component may be embedded, and a semiconductor package including the same.

According to an aspect of the present disclosure, a semiconductor package may include: an interposer substrate including a core substrate and a connection structure, the core substrate having at least one cavity and having through-vias connecting upper and lower surfaces thereof to each other, and the connection structure including an insulating member disposed on the upper surface of the core substrate and a redistribution layer disposed on the insulating member; at least one semiconductor chip disposed on an upper surface of the connection structure of the interposer substrate and including connection pads connected to the redistribution layer; a passive component accommodated in the at least one cavity; a first insulating layer disposed between the core substrate and the connection structure and encapsulating the passive component in the at least one cavity; a first wiring layer disposed on the first insulating layer and connecting the through-vias and the passive component to the redistribution layer; a second insulating layer disposed on the lower surface of the core substrate; and a second wiring layer disposed on a lower surface of the second insulating layer and connected to the through-vias.

According to another aspect of the present disclosure, a hybrid interposer may include: a core substrate having at least one cavity and having through-vias connecting upper and lower surfaces thereof to each other; a passive component accommodated in the at least one cavity; a first insulating layer disposed on the upper surface of the core substrate and encapsulating the passive component in the at least one cavity; a first wiring layer disposed on the first insulating layer and connected to the through-vias and the passive component; a second insulating layer disposed on the lower surface of the core substrate; a second wiring layer disposed on a lower surface of the second insulating layer and connected to the through-vias; and a connection structure including an insulating member disposed on the upper surface of the core substrate and a redistribution layer disposed on the insulating member and connected to the first wiring layer.

According to another aspect of the present disclosure, a semiconductor package may include: an interposer substrate including a core substrate and a connection structure, the core substrate having cavities in which passive components are embedded and having through-vias connecting upper and lower surfaces of the core substrate to each other, and the connection structure including an insulating member disposed on the upper surface of the core substrate and a redistribution layer disposed on the insulating member; semiconductor chips disposed on an upper surface of the connection structure and including connection pads connected to the redistribution layer; a first insulating layer disposed between the core substrate and the connection structure and encapsulating the passive component in the at least one cavity; a first wiring layer disposed on the first insulating layer and connecting the through-vias and the passive component to the redistribution layer; a second insulating layer disposed on the lower surface of the core substrate; and a second wiring layer disposed on a lower surface of the second insulating layer and connected to the through-vias. One of the cavities may overlap with two or more of the semiconductor chips adjacent to each other, in a plan view.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a downward direction in relation to cross sections of the drawings for convenience, while an upper side, an upper portion, an upper surface, and the like, are used to refer to an opposite direction to the downward direction. However, these directions are defined for convenience of explanation, and the claims are not particularly limited by the directions defined as described above, and concepts of upper and lower portions may be exchanged with each other.

The meaning of a "connection" of a component to another component in the description conceptually includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
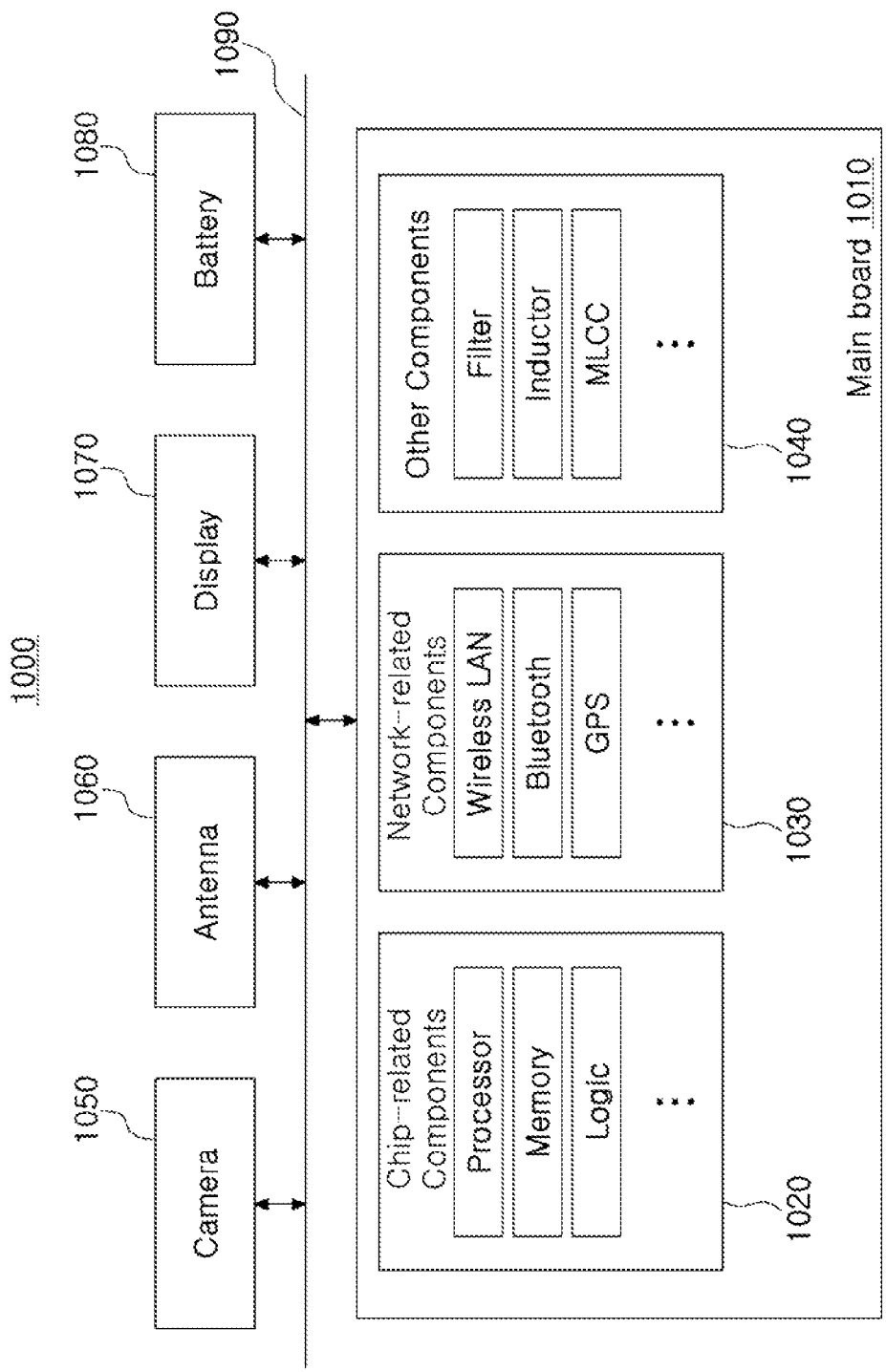
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
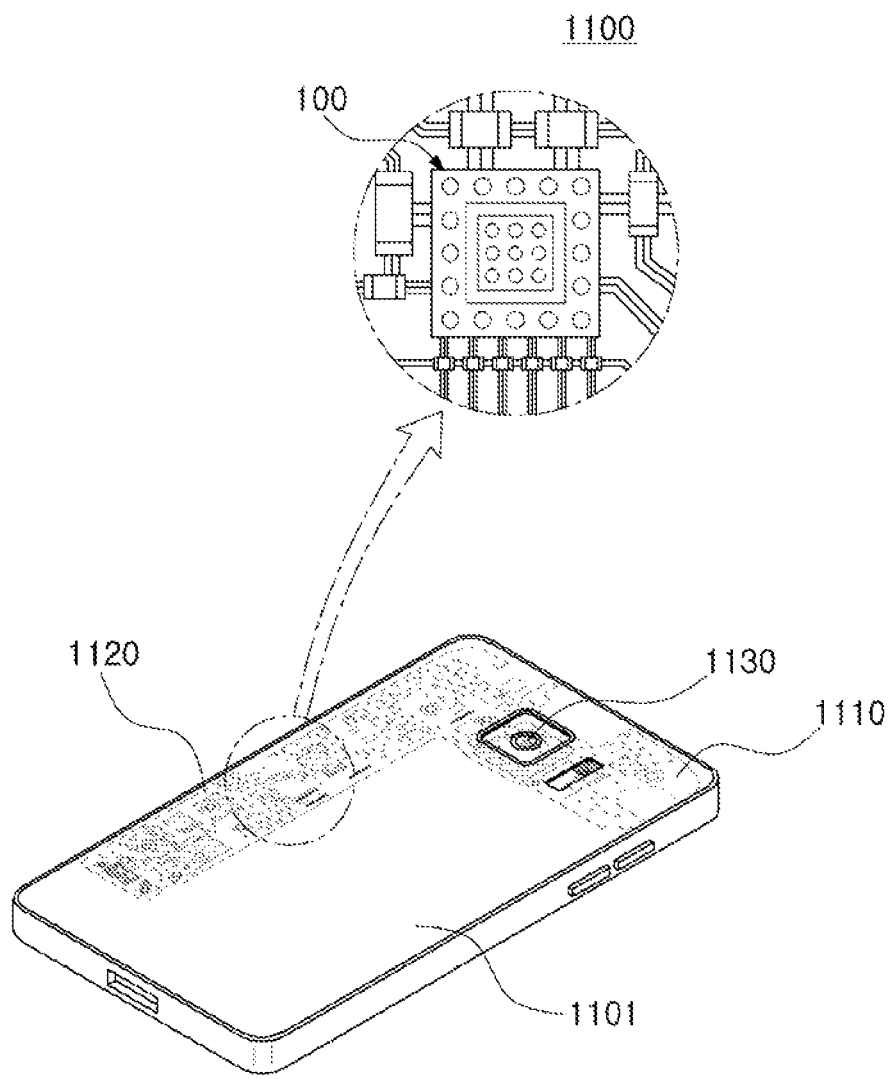
FIG. 2 is a schematic perspective view illustrating an example of an electronic device.

FIG. 2 is a schematic perspective view illustrating an example of an electronic device.

Referring to FIG. 2, a semiconductor device may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be chip related components, and some of the chip related components may be a semiconductor device 1121. Meanwhile, the electronic device is not necessarily limited to the smartphone 1100, but may be other electronic devices.

Semiconductor Device (or Semiconductor Package)

Generally, numerous fine electrical circuits are integrated in a semiconductor chip. However, the semiconductor chip may not serve as a semiconductor finished product in oneself, and may be damaged due to external physical or chemical impact. Therefore, the semiconductor chip is not used in oneself, and is packaged and is used in an electronic device, or the like, in a package state.

The reason why semiconductor packaging is required is that there is a difference in a circuit width between the semiconductor chip and a mainboard of the electronic device in terms of electrical connection. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor and the mainboard is required.

A semiconductor device manufactured by the packaging technology described above will hereinafter be described in more detail with reference to the drawings.

Figure 3:
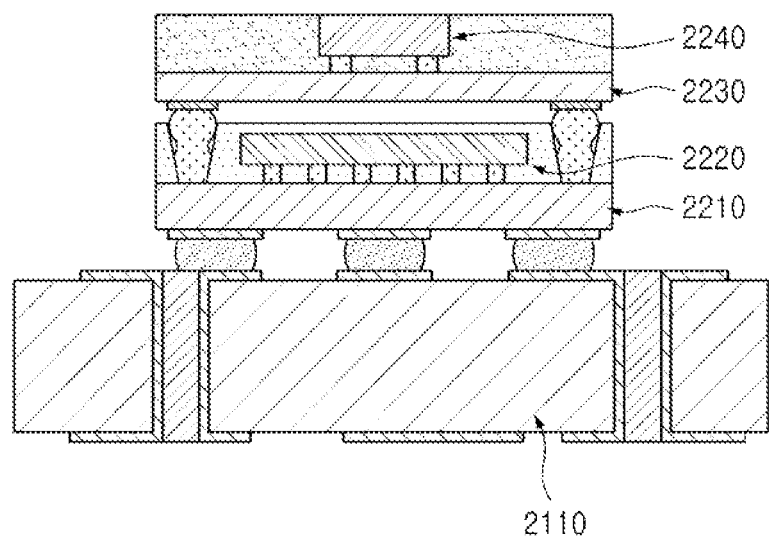
FIG. 3 is a schematic cross-sectional view illustrating a case in which a three-dimensional (3D) ball grid array (BGA) package is mounted on a main board of an electronic device.

FIG. 3 is a schematic cross-sectional view illustrating a case in which a three-dimensional (3D) ball grid array (BGA) package is mounted on a main board of an electronic device.

An application specific integrated circuit (ASIC) such as a graphics processing unit (GPU) among semiconductor chips is very expensive, and it is thus very important to perform packaging on the ASIC at a high yield. For this purpose, a ball grid array (BGA) substrate 2210, or the like, that may redistribute several thousands to several hundreds of thousands of connection pads is prepared before a semiconductor chip is mounted, and the semiconductor chip that is expensive, such as a GPU 2220, or the like, is mounted and packaged on the BGA substrate 2210 by surface mounting technology (SMT), or the like, and is then mounted ultimately on a main board 2110.

Meanwhile, in a case of the GPU 2220, it is required to significantly reduce a signal path between the GPU 2220 and a memory such as a high bandwidth memory (HBM). To this end, a product in which a semiconductor chip such as the HBM 2240 is mounted and then packaged on an interposer 2230, and is then stacked on a package in which the GPU 2220 is mounted, in a package-on-package (POP) form is used. However, in this case, a thickness of a device is excessive increased, and there is a limitation in significantly reducing the signal path.

Figure 4:
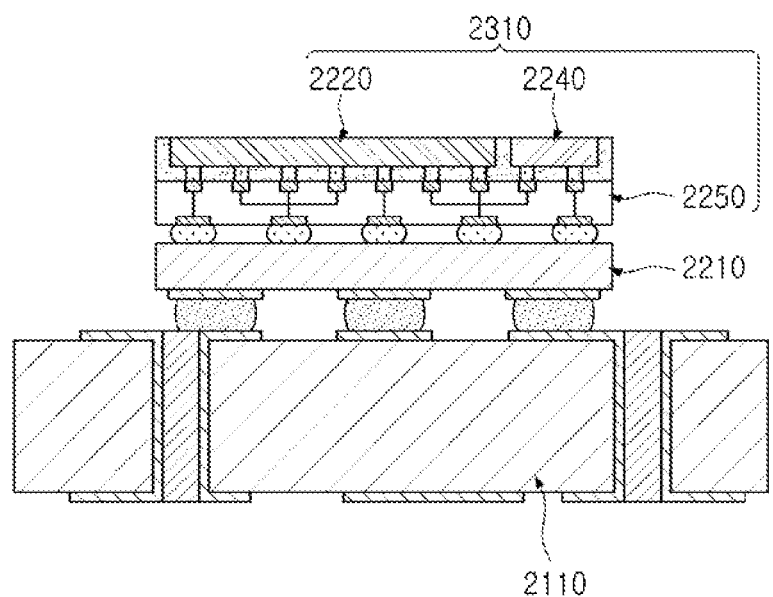
FIG. 4 is a schematic cross-sectional view illustrating a case in which a 2.5D silicon interposer package is mounted on a main board.

FIG. 4 is a schematic cross-sectional view illustrating a case in which a 2.5D silicon interposer package is mounted on a main board.

As a method for solving the problem described above, it may be considered to manufacture a semiconductor device 2310 by 2.5D interposer technology of surface-mounting and then packaging a first semiconductor chip such as a GPU 2220 and a second semiconductor chip such as an HBM 2240 side-by-side with each other on a silicon interposer 2250. In this case, the GPU 2220 and the HBM 2240 having several thousands to several hundreds of thousands of connection pads may be redistributed by the silicon interposer 2250, and may be electrically connected to each other at the shortest path. In addition, when the semiconductor device 2310 is again mounted and redistributed on a BGA substrate 2210, or the like, the semiconductor device 2310 may be ultimately mounted on a main board 2110. However, it is very difficult to form through-silicon vias (TSVs) in the silicon interposer 2250, and a cost required for manufacturing the silicon interposer 2250 is significantly high, and the silicon interposer 2250 is thus disadvantageous in increasing an area and reducing a cost.

Figure 5:
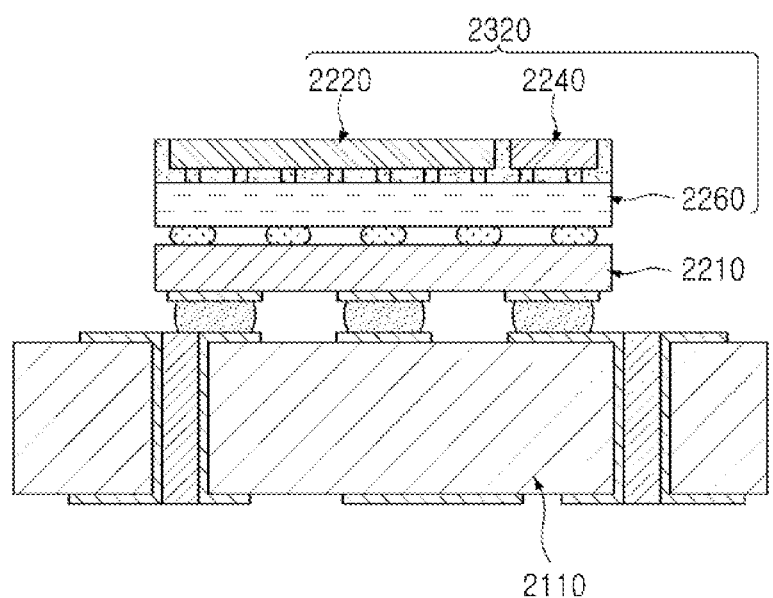
FIG. 5 is a schematic cross-sectional view illustrating a case in which a 2.5D organic interposer package is mounted on a main board.

FIG. 5 is a schematic cross-sectional view illustrating a case in which a 2.5D organic interposer package is mounted on a main board.

As a method for solving the problem described above, it may be considered to use an organic interposer 2260 instead of the silicon interposer 2250. For example, it may be considered to manufacture a semiconductor device 2320 by 2.5D interposer technology of surface-mounting and then packaging a first semiconductor chip such as a GPU 2220 and a second semiconductor chip such as an HBM 2240 side-by-side with each other on the organic interposer 2260. In this case, the GPU 2220 and the HBM 2240 having several thousands to several hundreds of thousands of connection pads may be redistributed by the organic interposer 2260, and may be electrically connected to each other at the shortest path. In addition, when the semiconductor device 2320 is again mounted and redistributed on a BGA substrate 2210, or the like, the semiconductor device 2320 may be ultimately mounted on a main board 2110. In addition, the organic interposer may be advantageous in increasing an area and reducing a cost.

Meanwhile, such a semiconductor device 2320 is manufactured by performing a package process of mounting chips 2220 and 2240 on the organic interposer 2260 and then molding the chips. The reason is that when a molding process is not performed, the semiconductor device is not handled, such that the semiconductor device may not be connected to the BGA substrate 2210, or the like. Therefore, rigidity of the semiconductor device is maintained by the molding. However, when the molding process is performed, warpage of the semiconductor device may occur, fillability of an underfill resin may be deteriorated, and a crack between a die and a molding material of the chips 2220 and 2240 may occur, due to mismatch between coefficients of thermal expansion (CTEs) of the interposer 2260 and the molding material of the chips 2220 and 2240, as described above.

Various exemplary embodiments in the present disclosure will hereinafter be described in detail with reference to the accompanying drawings.

Figure 6:
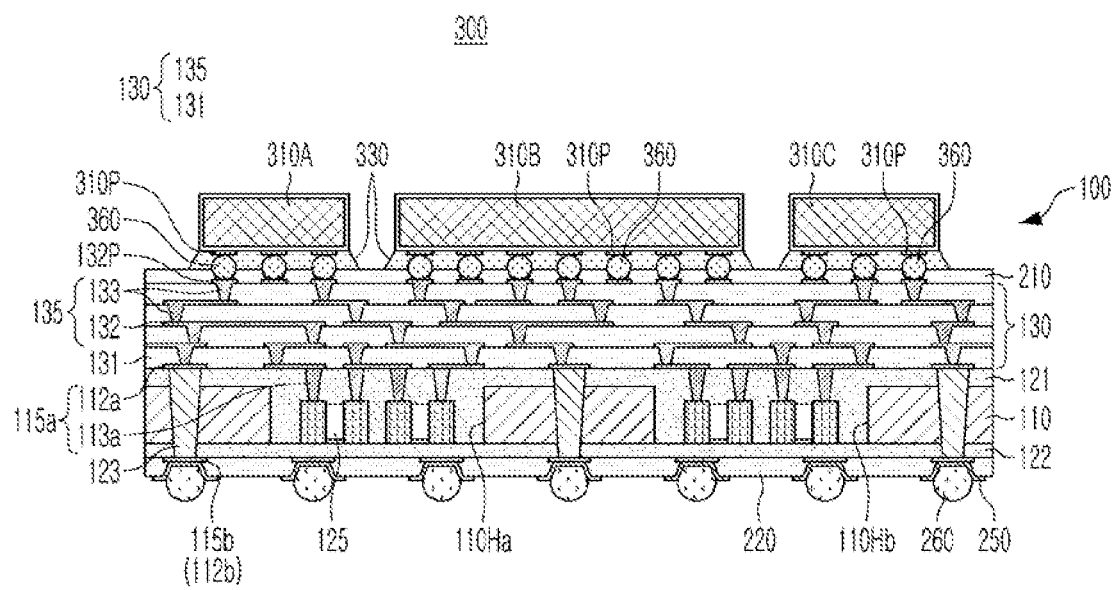
FIG. 6 is a schematic cross-sectional view illustrating a semiconductor package according to an exemplary embodiment in the present disclosure.
Figure 7:
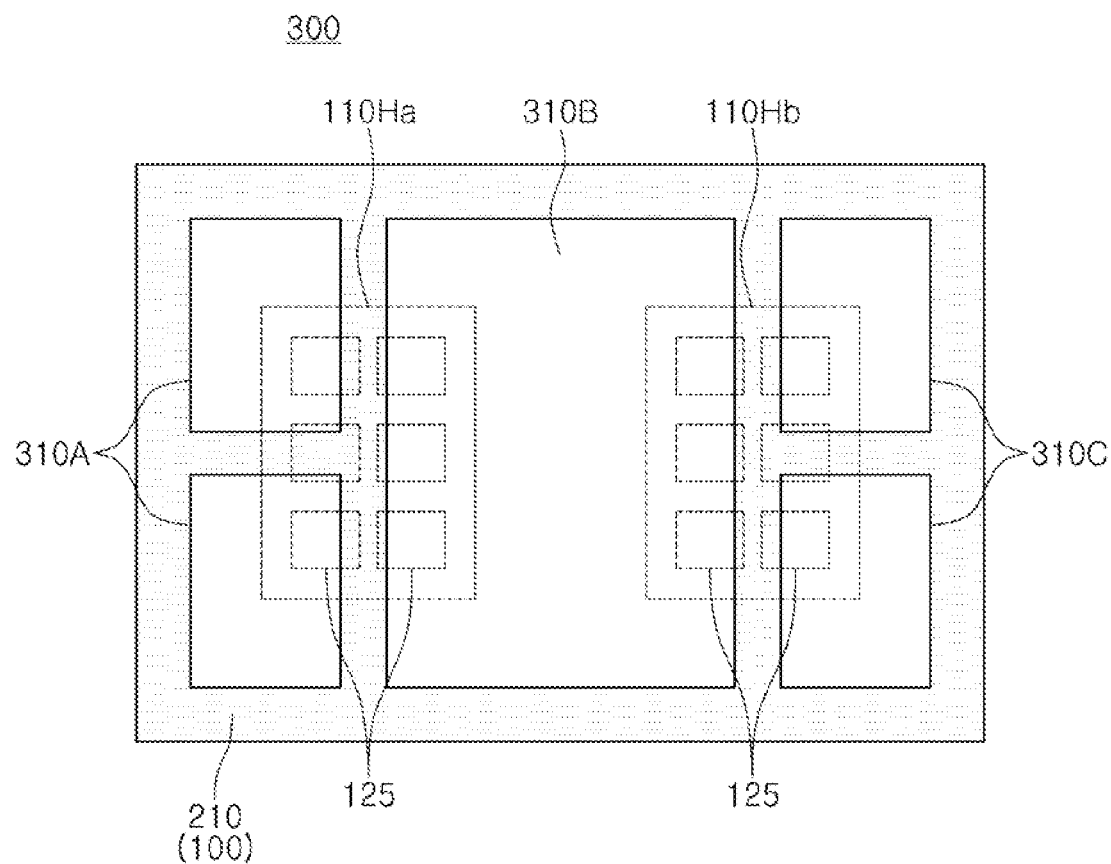
FIG. 7 is a plan view illustrating the semiconductor package illustrated in FIG. 6.

FIG. 6 is a schematic cross-sectional view illustrating a semiconductor package according to an exemplary embodiment in the present disclosure, and FIG. 7 is a plan view illustrating the semiconductor package illustrated in FIG. 6.

Referring to FIGS. 6 and 7, a semiconductor package 300 according to the present exemplary embodiment may include an interposer substrate 100 and a plurality of semiconductor chips 310A, 310B, and 310C disposed on the interposer substrate 100. The interposer substrate 100 used in the present exemplary embodiment may be a hybrid interposer in which a core substrate 110 and a connection structure 130 are coupled to each other.

The core substrate 110 may have first and second cavities 110Ha and 110Hb and include through-vias 123 connecting upper and lower surfaces of the core substrate 110 to each other, and a plurality of passive components 125 may be accommodated in the first and second cavities 110Ha and 110Hb. First and second insulating layers 121 and 122 may be disposed on the upper and lower surfaces of the core substrate 110, respectively.

The core substrate 110 may provide a space for accommodating the plurality of passive components 125, and serve to increase rigidity of the interposer substrate 100. The core substrate 110 may include an organic insulating material, for example, a thermosetting resin such as an epoxy resin or a thermoplastic resin such as polyimide. In some exemplary embodiments, the core substrate 110 may be formed of a mixture of the insulating material, which is a main material, and other inorganic components. For example, the core substrate 110 may include a resin mixed with an inorganic filler or a resin in which a glass fiber is impregnated together with an inorganic filler. In a specific example, the core substrate may be formed of Ajinomoto Build-up Film (ABF) or prepreg.

The first insulating layer 121 may be disposed between the core substrate 110 and the connection structure 130, and may be filled in at least portions of the first and second cavities 110Ha and 110Hb to encapsulate the plurality of passive components 125. The through-vias 123 and a first wiring layer 115a connected to each of the plurality of passive components 125 may be disposed in and on the first insulating layer 121. In detail, the first wiring layer 115a may include a first wiring pattern 112a disposed on an upper surface of the first insulating layer 121 and connected to the through-vias 123 and connection vias 113a penetrating through the first insulating layer 121 and connected to electrodes of the plurality of passive components 125.

The second insulating layer 122 may be disposed on the lower surface of the core substrate 110, and a second wiring layer 115b connected to the through-vias 123 may be disposed on a lower surface of the second insulating layer 122. The electrodes of the plurality of passive components 125 may be connected to the connection vias 113a of the first wiring layer 115a. The plurality of passive components 125 may include, for example, a high frequency inductor, a ferrite inductor, a power inductor, ferrite beads, a low temperature co-firing ceramic (LTCC), an electromagnetic interference (EMI) filter, a multilayer ceramic capacitor (MLCC), or the like. However, the plurality of passive components 125 are not limited thereto, but may also include passive components used for various other purposes, or the like.

The plurality of passive components 125 may have different sizes and thicknesses. The first and second cavities 110Ha and 110Hb may have the size that is the same as or greater than that of a passive component having the greatest thickness. The first cavity 110Ha may overlap with two or more of semiconductor chips including the first semiconductor chips 310A and the second semiconductor chip 310B adjacent to each other, in a plan view. The second cavity 110Hb may overlap with two or more of semiconductor chips including the second semiconductor chip 310B and the third semiconductor chips 310C adjacent to each other, in the plan view. As such, electrical paths from respective semiconductor chips passing through respective passive components in a respective cavity to respective second electrical connection metals may be shortened. The plurality of passive components 125 may be disposed on the same level on one reference surface. In the present exemplary embodiment, one surfaces of the plurality of passive components 125 may be arranged in parallel with one another on an upper surface of the second insulating layer 122, which is the reference surface. For example, lower surfaces of the plurality of passive components 125, a lower surface of the core substrate 110, and the upper surface of the second insulating layer 122 may be coplanar with or substantially coplanar with each other.

The connection structure 130 may include an insulating member 131 disposed on the upper surface of the core substrate 110 and redistribution layers 135 formed on the insulating member 131.

A case in which the redistribution layers 135 used in the present exemplary embodiment have a three-level structure is exemplified. In detail, the insulating member 131 may include three insulating layers, and may include, for example, a photoimagable dielectric (PID). The redistribution layer 135 may be formed in a fine pattern by a photolithography process by using the PID.

The redistribution layers 135 may include three-level redistribution patterns 132 disposed on the three insulating layers 131 and redistribution vias 133 penetrating through the insulating layers 131 and connected to the redistribution pattern 132. The lowermost redistribution layer 135 may be connected to the first wiring layer 115a disposed on the core substrate 110, and the uppermost redistribution layer 135, particularly, the redistribution pattern 132 may be provided as connection lands 132P. The connection lands 132P may be connected to connection pads 310P of the first to third semiconductor chips 310A, 310B, and 310C by first electrical connection metals 360. The connection lands 132P may include a surface treatment layer. The surface treatment layer may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like, but is not limited thereto.

As described above, the interposer 100 according to the present exemplary embodiment may be configured by coupling the core substrate 110 for mounting the passive components 125 and the connection structure 130 implemented in a fine pattern on the core substrate 110 to each other. Therefore, an entire thickness of the interposer 100 may be relatively small, the passive components 125 may be disposed adjacent to the first to third semiconductor chips 310A, 310B, and 310C, and the core substrate 110 may be used as a carrier in a process of manufacturing the interposer 100.

The respective components included in the semiconductor package 300 according to the present exemplary embodiment will hereinafter be described in more detail.

Each of the first to third semiconductor chips 310A, 310B, and 310C may be an integrated circuit (IC) provided in an amount of several hundreds to several millions of elements or more integrated in a single chip. In this case, a base material of a body of each of the semiconductor chips may be silicon (Si), germanium (Ge), gallium arsenide (GaAs), or the like. Various circuits may be formed on each of the bodies.

The respective connection pads 310P of the first to third semiconductor chips 310A, 310B, and 310C may electrically connect the first to third semiconductor chips 310A, 310B, and 310C to another component (for example, the interposer 100), and a material of each of the connection pads 310P may be any conductive material such as aluminum (Al), or the like. Passivation layers exposing the connection pads 310P may be formed on the respective bodies, and may be oxide layers, nitride layers, or the like, or double layers of an oxide layer and a nitride layer.

Insulating layers, and the like, may further be disposed in required positions. In some exemplary embodiment, separate redistribution layers may further be formed on active surfaces of the first to third semiconductor chips 310A, 310B, and 310C, and the first electrical connection metals 360 may connect the connection pads 310P to the connection lands 132P and include a low melting point metal such as a solder. The first to third semiconductor chips 310A, 310B, and 310C may be fixed onto the interposer 100 by an underfill resin 330.

For example, a second semiconductor chip 310B may be an ASIC such as a GPU. First and third semiconductor chips 310A and 310C may be memories such as HBMs. That is, each of the first to third semiconductor chips 310A, 310B, and 310C may be an expensive chip having several hundreds of thousands or more of inputs/outputs (I/Os), but is not limited thereto. For example, the first and third semiconductor chips 310A and 310C, which are the HBMs, or the like, may be disposed side-by-side with the second semiconductor chip 310B, which is the ASIC such as the GPU, or the like, at both sides of the second semiconductor chip 310B, respectively.

The connection structure 130 of the interposer 100 may redistribute the respective connection pads 310P of the first to third semiconductor chips 310A, 310B, and 310C. Several tens to several hundreds of connection pads 310P of each of the semiconductor chips 310A, 310B, and 310C having various functions may be redistributed by the interposer 100, and may be physically and/or electrically externally connected through second electrical connection metals 260 depending on functions. The connection structure 130 may include a plurality of insulating layers 131 and redistribution layers 135 disposed on the plurality of insulating layers 131, as described above. A case in which the number of levels of the connection structure 130 is three is exemplified, but the number of levels of the connection structure 130 may be one or plural.

The redistribution layers 135 may serve to substantially redistribute the connection pads 310P. A material of each of the redistribution layers 135 may be a conductive material such as copper (Cu), aluminum (Al), silver (Ag), tin (Sn), gold (Au), nickel (Ni), lead (Pb), titanium (Ti), or alloys thereof. The redistribution layers 135 may perform various functions depending on designs of corresponding layers. For example, the redistribution layers 135 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 135 may include via pads and connection lands.

A material of each of the first and second insulating layers 121 and 122 may be a thermosetting resin such as an epoxy resin, a thermoplastic resin such as a polyimide resin, a resin in which the thermosetting resin and the thermoplastic resin are mixed with an inorganic filler, for example, ABF, or the like. The first and second wiring layers 115a and 115b and the through-vias 123 may provide a wiring structure connecting the redistribution layer 135 of the connection structure 130 and the second electrical connection metals 260 to each other. In addition, the first wiring layer 115a may be connected to the plurality of passive components 125 to electrically connect the first to third semiconductor chips 310A, 310B, and 310C to other circuit layers. For example, a material of each of the first and second wiring layers 115a and 115b and the through-vias 123 may be a conductive material such as copper (Cu), aluminum (Al), silver (Ag), tin (Sn), gold (Au), nickel (Ni), lead (Pb), titanium (Ti), or alloys thereof.

First and second passivation layers 210 and 220 may protect the interposer 100 from external physical or chemical damage. In detail, the first passivation layer 210 may be disposed on an upper surface of the connection structure 130 to protect the connection structure 130 and the redistribution layer 135, and the second passivation layer 220 may be disposed on the lower surface of the core substrate 110. The first and second passivation layers 210 and 220 may include, respectively, the connection lands 132P and openings opening portions of the second wiring layer 115b. For example, the first and second passivation layers 210 and 220 may be formed of the same material as the insulating material of the first and second insulating layers 121 and 122 described above, for example, ABF.

The underbump metal layers 250 may improve connection reliability of the electronic connection metals 260, resulting in improvement of board level reliability of the semiconductor package 300. The underbump metal layers 250 may be formed in the openings of the second passivation layer 220 and may be electrically connected to the second wiring layer 115b. The underbump metal layers 250 may be formed by any known metallization method. That is, the underbump metal layers 250 may include any known metal such as copper (Cu).

The second electrical connection metals 260 may physically or electrically externally connect the semiconductor package 300 including an organic interposer. For example, the semiconductor package 300 may be mounted on the mainboard of the electronic device through the electrical connection metals 260. Each of the electrical connection metals 260 may be formed of a conductive material, for example, a solder, or the like. However, this is only an example, and a material of each of the electrical connection metals 260 is not particularly limited thereto. Each of the electrical connection metals 260 may be a land, a ball, a pin, or the like. The electrical connection metals 260 may be formed as a multilayer or single layer structure. When the electrical connection metals 260 are formed as a multilayer structure, the electrical connection metals 260 may include a copper (Cu) pillar and a solder. When the electrical connection metals 260 are formed as a single layer structure, the electrical connection metals 260 may include a tin-silver solder or copper (Cu). However, this is only an example, and the electrical connection metals 260 are not limited thereto.

The number, an interval, a disposition form, and the like, of electrical connection metals 260 are not particularly limited, but may be sufficiently modified depending on design particulars by those skilled in the art. For example, the electrical connection metals 260 may be provided in an amount of several tens to several thousands according to the number of connection pads 310P of the first to third semiconductor chips 310A, 310B, and 310C may be provided in an amount of several tens to several thousands or more or several tens to several thousands or less. Some of the electrical connection metals 260 may be disposed in a fan-out region. The fan-out region refers to a region except for a region in which the first to third semiconductor chips 310A, 310B, and 310C are disposed. That is, the semiconductor package 300 including a hybrid interposer according to the exemplary embodiment may be a fan-out semiconductor device. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

The underfill resin 330 may fix the first to third semiconductor chips 310A, 310B, and 310C onto the hybrid interposer 100. Any known material including epoxy, or the like, may be used as a material of the underfill resin 330. In some exemplary embodiments, the underfill resin 330 may be omitted. Meanwhile, although not illustrated in the drawings, additional passive components may be disposed side-by-side with the first to third semiconductor chips 310A, 310B, and 310C on the interposer 100 and be then packaged, if necessary.

A method of manufacturing the semiconductor package illustrated in FIG. 6 will hereinafter be described with reference to FIGS. 8A through 8F and FIGS. 9A through 9D. Various advantageous and effects will be described in detail in a method of manufacturing the semiconductor package, particularly, the hybrid interposer.

FIGS. 8A through 8F are cross-sectional views illustrating main processes of manufacturing a core substrate.

Figure 8A:
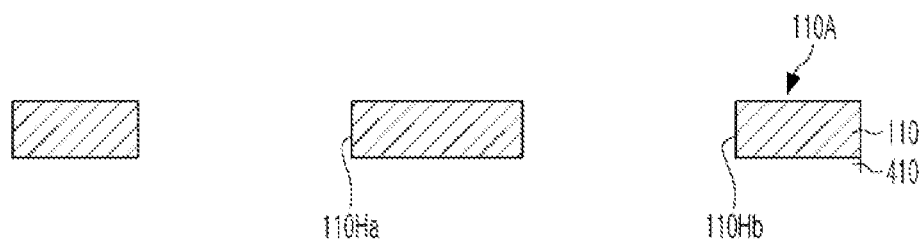
FIGS. 8A through 8F are cross-sectional views illustrating main processes of manufacturing a core substrate.

Referring to FIG. 8A, the first and second cavities 110Ha and 110Hb may be formed in the core substrate 110 having the first and second surfaces 110A and 110B opposing each other.

The core substrate 110 may be a copper clad laminate (CCL) having metal layers disposed on the first and second surfaces 110A and 110B. The core substrate 110 illustrated in FIG. 8A, which is a portion corresponding to a single semiconductor package, may be understood to be a portion of a large panel. An actual process may be performed in a panel unit, and a panel may be cut ultimately (after a process of FIG. 9D) to obtain individual packages. A process of forming the first and second cavities 110Ha and 110Hb may be performed using a laser drill, a mechanical drill, a sandblast, or the like.

Figure 8B:
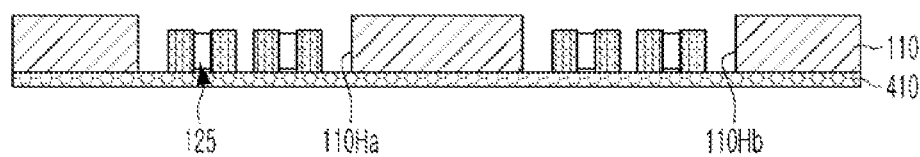

Referring to FIG. 8B, an adhesive film 410 may be attached to the second surface 110B of the core substrate 110, and the plurality of passive components 125 may be disposed in the first and second cavities 110Ha and 110Hb.

The adhesive film 410 may be an adhesive tape including an epoxy resin. The plurality of passive components 125 may include a high frequency inductor, a ferrite inductor, a power inductor, ferrite beads, an LTCC, an EMI filter, as well as a capacitor such as an MLCC. A form in which the plurality of passive components 125 have the same thickness is exemplified, but the plurality of passive components 125 may have different sizes and thicknesses. The first and second cavities 110Ha and 110Hb may have the size that is the same as or greater than that of a passive component having the greatest thickness. The plurality of passive components 125 may be arranged side-by-side with one another on a carrier film 410.

Figure 8C:
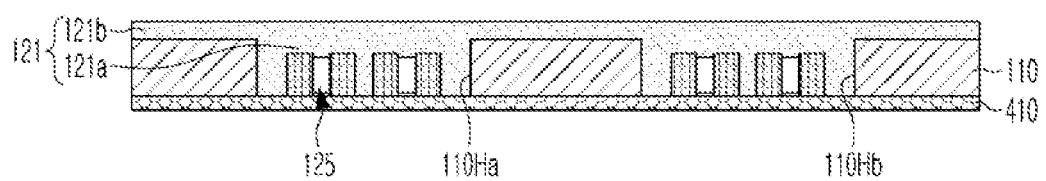

Referring to FIG. 8C, the first insulating layer 121 may be formed on the first surface 110A of the core substrate 110 having the first and second cavities 110Ha and 110Hb in which the plurality of passive components 125 are disposed.

In the present process, the first insulating layer 121 may be formed to cover the first surface 110A of the core substrate 110 while filling at least portions of the first and second cavities 110Ha and 110Hb using an insulating material such as ABF. The first insulating layer 121 may include an encapsulating region 121a encapsulating the plurality of passive components 125 and a flat region 121b for the first wiring layer in a subsequent process.

Figure 8D:
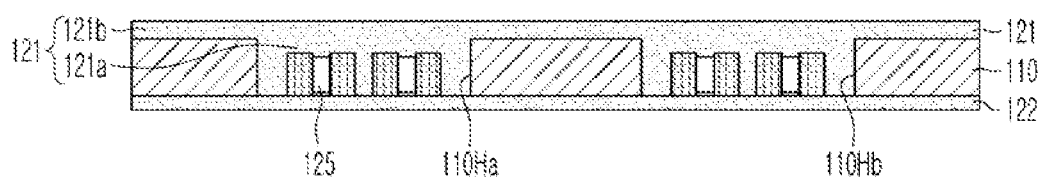

Referring to FIG. 8D, the adhesive film 410 may be removed, and the second insulating layer 122 may be formed on the second surface 110B of the core substrate 110.

On a surface from which the adhesive film is removed, the encapsulating region of the first insulating layer 121 and one surfaces of the plurality of passive components 125 may be exposed together with the second surface of the core substrate 110. The second insulating layer 122 may be formed on the surface from which the adhesive film 410 is removed. The second insulating layer 122 may be formed by a laminating or applying method using an insulating material such as ABF, similar to the process of forming the first insulating layer.

Figure 8E:
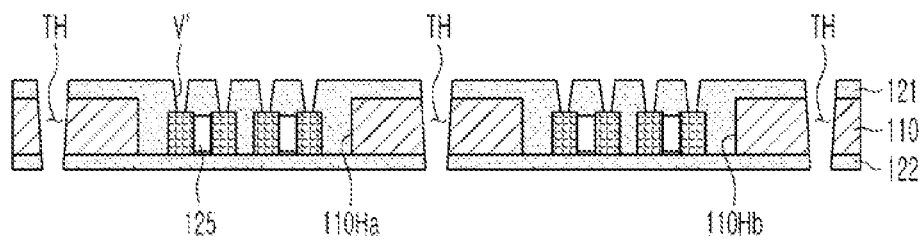

Referring to FIG. 8E, through-holes and via holes may be formed in the core substrate 110 and the first insulating layer 121.

The through-holes TH may be formed by drilling the core substrate 110 having the first and second insulating layers 121 and 122 disposed on opposite surfaces thereof, and the via holes V' partially penetrating through the first insulating layer 121 and connected to electrodes of the plurality of passive components 125 may be formed. Such a drilling process may be performed using a laser drill. In some exemplary embodiments, additional via holes (not illustrated) connected to the passive components 125 may also be formed in the second insulating layer 122 (see FIG. 11).

Figure 8F:
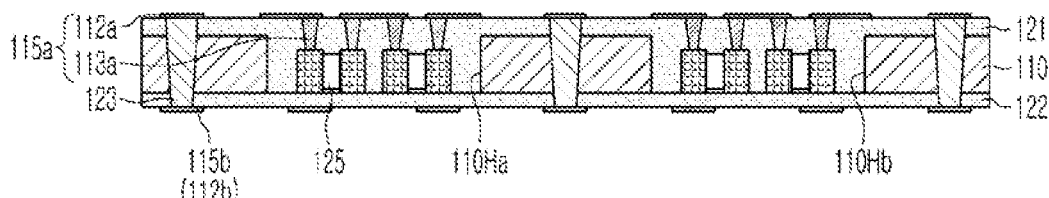

Referring to FIG. 8F, the through-vias 123 and the first and second wiring layers 115a and 115b may be formed to provide the wiring structure of the core substrate 110.

The present process may be performed by a single plating process. The through-vias 123 may be formed in the through-holes TH of the core substrate 110 to form an electrical connection path connecting the opposite surfaces of the core substrate 110 to each other. The first wiring layer 115a connected to the plurality of passive components 125 may be formed on the first insulating layer 121, and the second wiring layer 115b connected to the through-vias 123 may be formed on the second insulating layer 122. The first wiring layer 115a may include the first wiring pattern 112a disposed on the first insulating layer 121 and the connection vias 113a penetrating through the first insulating layer 121 and connected to the plurality of passive components 125.

The core substrate 110 in which the plurality of passive components 125 are embedded may be prepared by the processes described above. The core substrate 110 illustrated in FIG. 8F may substitute for a function of a carrier for forming the connection structure 130 in a subsequent process of manufacturing a hybrid interposer. Therefore, the carrier may not be separately used in a process of forming the connection structure.

FIGS. 9A through 9D are cross-sectional views for describing main processes of methods of manufacturing a hybrid interposer and a semiconductor package.

Figure 9A:
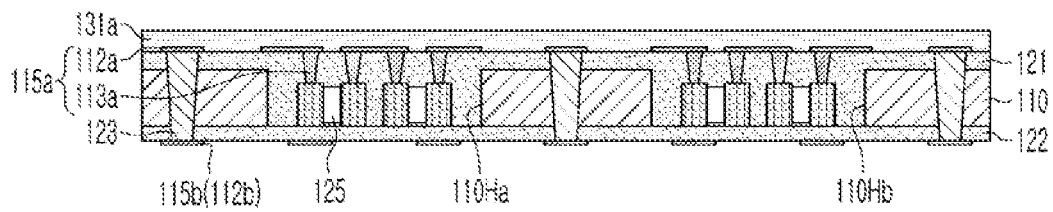
FIGS. 9A through 9D are cross-sectional views for describing main processes of methods of manufacturing a hybrid interposer and a semiconductor package.

Referring to FIG. 9A, an insulating layer 131a for the connection structure may be formed on the core substrate 110.

The insulating layer 131a may be formed on the first insulating layer 131 so as to cover the first wiring layer by a laminating or applying method. The insulating layer 131a for the connection structure may be formed of a PID, as described above. Therefore, a redistribution layer may be formed in a fine pattern by a photolithography method.

Figure 9B:
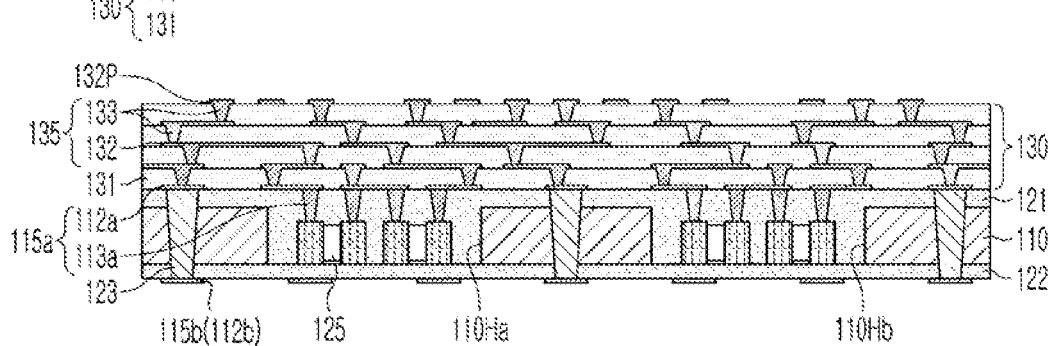

Referring to FIG. 9B, the connection structure 130 having the redistribution layer 135 may be formed.

The redistribution layer 135 may be formed by forming holes in the first insulating layer 131a by a photolithography process, forming a seed layer, and forming a pattern using a dry film, or the like, and filling the pattern by a plating process. The plating process may be a subtractive process, an additive process, a semi-additive process (SAP), a modified semi-additive process (MSAP), or the like, but is not limited thereto. The connection structure 130 may be formed by repeatedly performing processes of forming the insulating layer 131 and the redistribution layer 135 by the desired number of times.

Figure 9C:
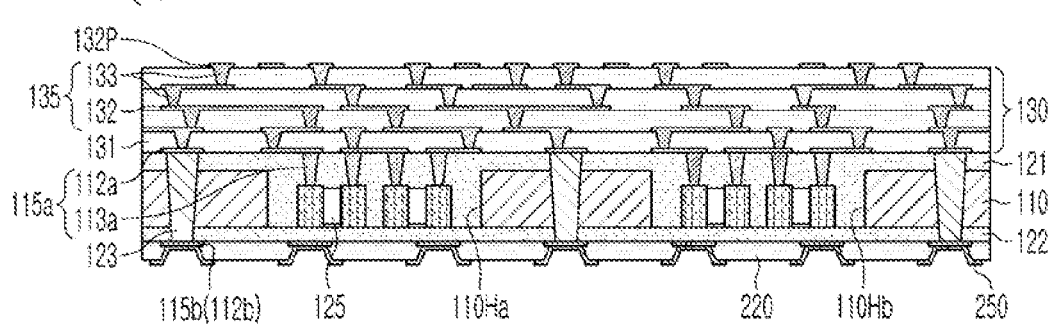

Referring to FIG. 9C, the second passivation layer 220 may be formed on a lower surface of the second insulating layer 122, and openings may be formed in the second passivation layer 220 so that partial regions of the second wiring layer 115b are exposed. Then, the underbump metal layers 250 may be formed on the second passivation layer 220 so as to be connected to the second wiring layer 115b through the openings.

In addition, the connection lands 132P may be provided by forming a surface treatment layer on the uppermost redistribution pattern 132. After the present process is completed, a quad route test, an electrical test of the redistribution layer 135 and the wiring structure, or the like, may be performed, if necessary.

Figure 9D:
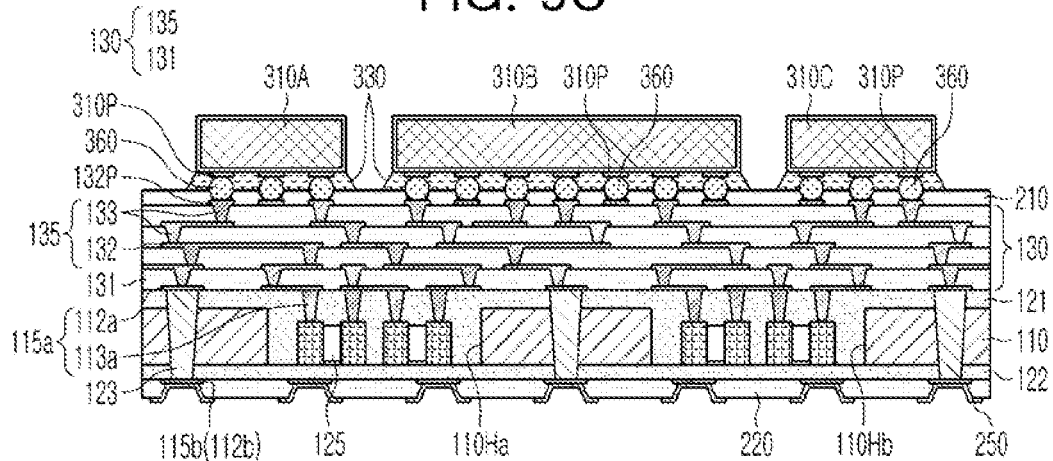

Referring to FIG. 9D, the first to third semiconductor chips 310A, 310B, and 310C may be mounted on the hybrid interposer 100.

Before such a process of mounting the first to third semiconductor chips 310A, 310B, and 310C, the first passivation layer 210 may be formed on the upper surface of the connection structure 130, and openings may be formed in the first passivation layer 210 so that partial regions of the connection lands 132P are exposed. The respective connection pads of the first to third semiconductor chips 310A, 310B, and 310C may be connected to the connection lands 132P using the first electrical connection metals 360 such as the solder, and the first to third semiconductor chips 310A, 310B, and 310C may be firmly fixed to the hybrid interposer 100 by the underfill resin 330.

The processes described above are only an example, and some processes may be added, changed, or deleted, if necessary, or the processes may be performed in a sequence different from the sequence described above. In some exemplary embodiments, after the process of mounting the first to third semiconductor chips 310A, 310B, and 310C, an encapsulant surrounding the first to third semiconductor chips 310A, 310B, and 310C may be additionally formed on the hybrid interposer 100 (see FIG. 10). In some exemplary embodiments, the processes of forming the second passivation layer 220 and the underbump metal layers 250 may also be performed after the first passivation layer 210 is formed.

The semiconductor package described above may be variously modified. For example, the passive components embedded in the core substrate may be replaced by other components such as semiconductor chips (see FIG. 10). In addition, the passive components embedded in the core substrate may be connected to the second wiring layer as well as to the first wiring layer (see FIGS. 11 and 12).

Semiconductor packages according to various exemplary embodiments in the present disclosure will hereinafter be described in detail with reference to the accompanying drawings.

Figure 10:
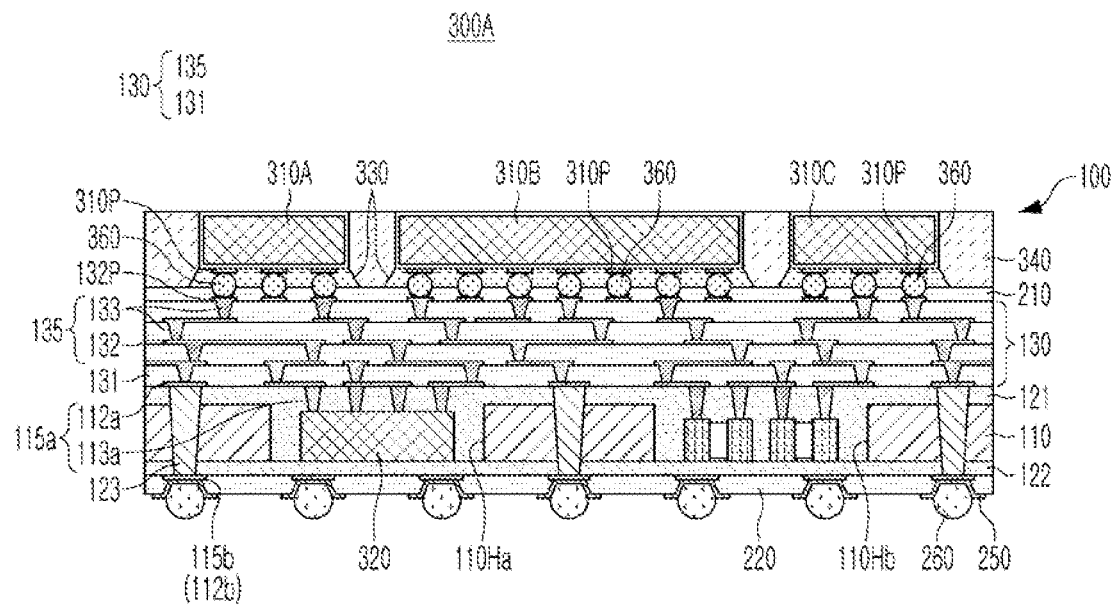
FIGS. 10 through 13 are schematic cross-sectional views illustrating semiconductor packages according to various exemplary embodiments in the present disclosure.

FIG. 10 is a schematic cross-sectional view illustrating a semiconductor package according to another exemplary embodiment in the present disclosure.

Referring to FIG. 10, it may be understood that a semiconductor package 300A according to the present exemplary embodiment has a structure similar to that illustrated in FIGS. 6 and 7 except that additional semiconductor chips 320 are used instead of the passive components in a first cavity 110Ha and an encapsulant 340 is formed. Components according to the present exemplary embodiments may be understood with reference to the description for the same or similar components of the semiconductor package 300 illustrated in FIGS. 6 and 7 unless explicitly described to the contrary.

In the present exemplary embodiment, the passive components 125 may be accommodated in a second cavity 110Hb, and the additional semiconductor chips 320 may be accommodated in the first cavity 110Ha. When the core substrate includes the plurality of cavities as described above, another type of components such as semiconductor chips rather than the passive components may be accommodated in some of the cavities or the remaining spaces of the cavities in which the passive components are mounted.

In addition, the encapsulant 340 may be disposed on the interposer 100 so as to surround the first to third semiconductor chips 310A, 310B, and 310C. In the present exemplary embodiment, an upper surface of the encapsulant 340 may be substantially coplanar with upper surfaces of the first to third semiconductor chips 310A, 310B, and 310C so that the upper surfaces of the first to third semiconductor chips 310A, 310B, and 310C are exposed.

Figure 11:
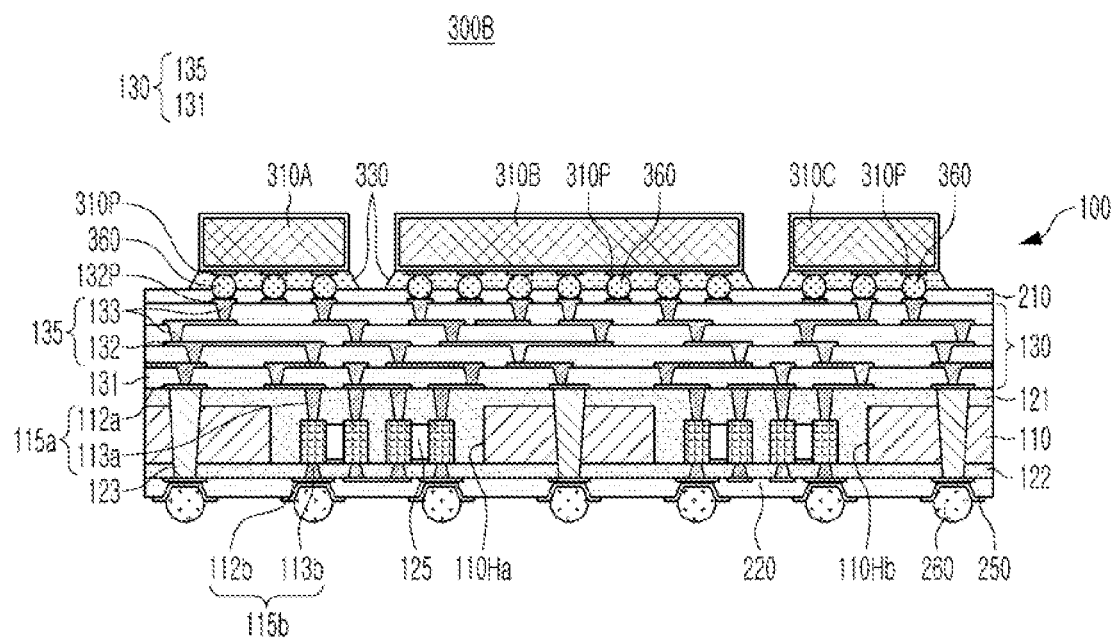

FIG. 11 is a schematic cross-sectional view illustrating a semiconductor package according to another exemplary embodiment in the present disclosure.

Referring to FIG. 11, it may be understood that a semiconductor package 300B according to the present exemplary embodiment has a structure similar to that illustrated in FIGS. 6 and 7 except that a plurality of passive components 125 are connected to a second wiring layer 115b as well as to a first wiring layer 115a. Components according to the present exemplary embodiments may be understood with reference to the description for the same or similar components of the semiconductor package 300 illustrated in FIGS. 6 and 7 unless explicitly described to the contrary.

In the present exemplary embodiment, the plurality of passive components 125 may be connected to the second wiring layer 115b as well as to the first wiring layer 115a. The second wiring layer 115b may include a second wiring pattern 112b disposed on a lower surface of a second insulating layer 122 and connected to through-vias 123 and second connection vias 113b penetrating through the second insulating layer 122 and connected to the passive components 125. In the present exemplary embodiment, a form in which the first and second wiring layers 115a and 115b are connected to both of opposite surfaces of the passive components 125 is exemplified, but in another exemplary embodiment, only the second wiring layer 115b rather than the first wiring layer 115a may be connected to one surfaces of the passive components 125.

Figure 12:
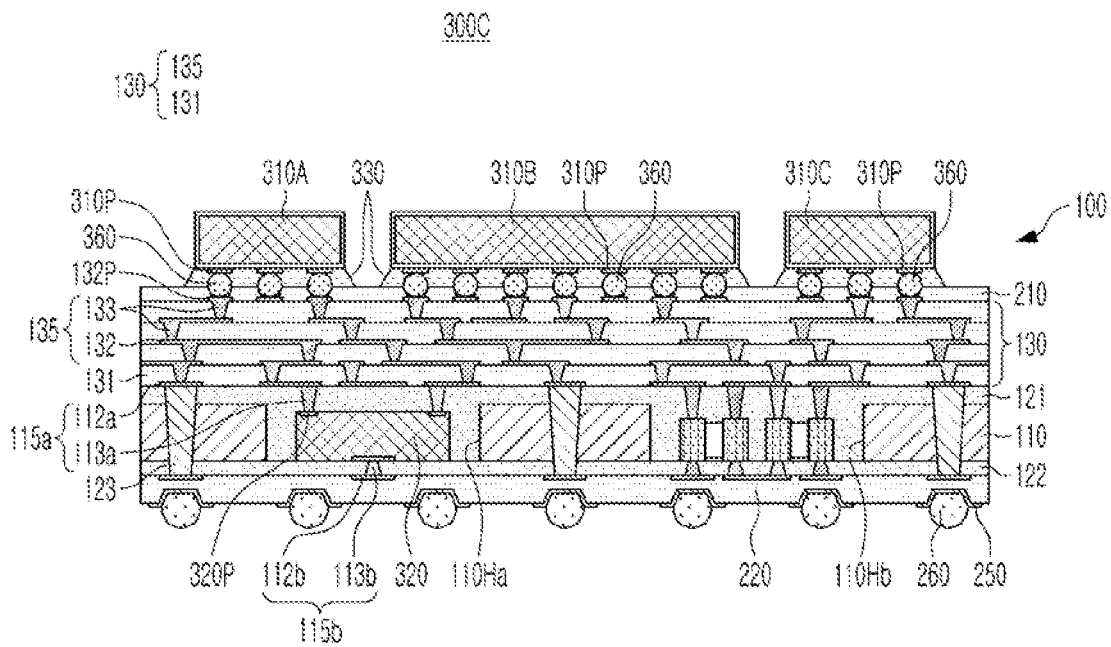

FIG. 12 is a schematic cross-sectional view illustrating a semiconductor package according to another exemplary embodiment in the present disclosure.

Referring to FIG. 12, it may be understood that a semiconductor package 300C according to the present exemplary embodiment has a structure similar to that illustrated in FIGS. 6 and 7 except that additional semiconductor chips 320 are used instead of the passive components in a first cavity 110Ha and the additional semiconductor chips 320 as well as the plurality of passive components 125 are connected to both of a first wiring layer 115a and a second wiring layer 115b. Components according to the present exemplary embodiments may be understood with reference to the description for the same or similar components of the semiconductor package 300 illustrated in FIGS. 6 and 7 unless explicitly described to the contrary.

The second wiring layer 115b may include a second wiring pattern 112b disposed on a lower surface of a second insulating layer 122 and connected to through-vias 123 and second connection vias 113b penetrating through the second insulating layer 122 and connected to the passive components 125, similar to another exemplary embodiment illustrated in FIG. 11.

In the present exemplary embodiment, the additional semiconductor chips 320 as well as the passive components 125 may be connected to the first wiring layer 115a and the second wiring layer 115b. The additional semiconductor chips 320 may be semiconductor chips having connection pads 320P disposed on upper and lower surfaces thereof. The additional semiconductor chips 320 may be, for example, power device chips such as insulated gate bipolar transistors (IGBTs) and field effect transistors (FETs).

Figure 13:
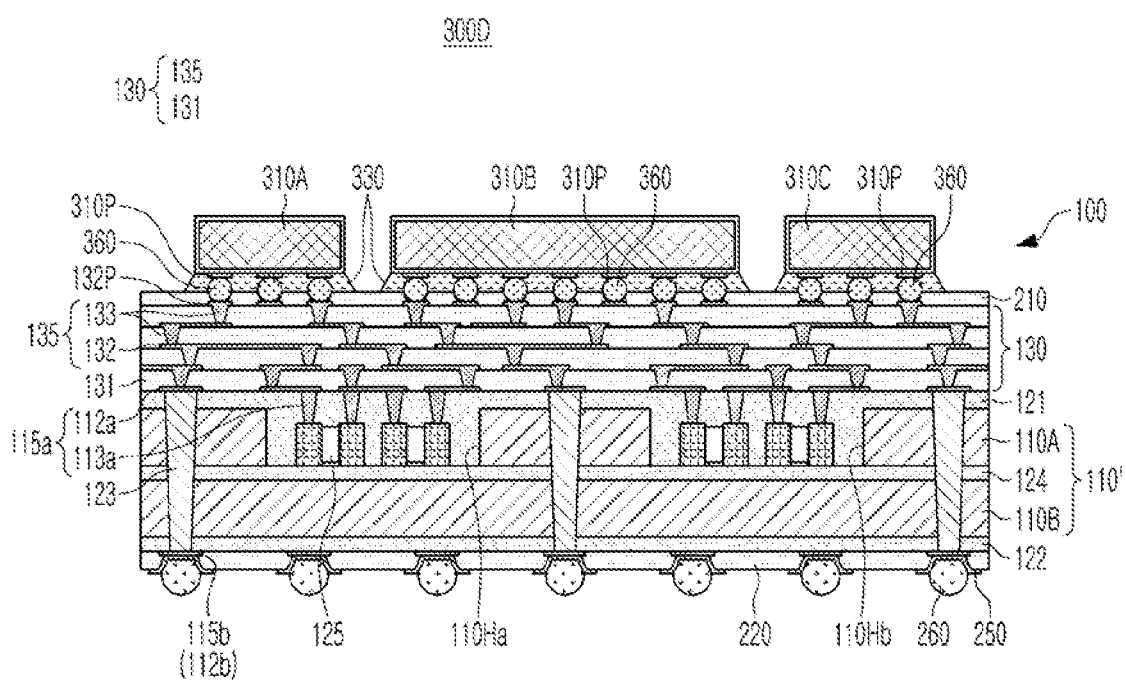

FIG. 13 is a schematic cross-sectional view illustrating a semiconductor package according to another exemplary embodiment in the present disclosure.

Referring to FIG. 13, it may be understood that a semiconductor package 300D according to the present exemplary embodiment has a structure similar to that illustrated in FIGS. 6 and 7 except that a core substrate 100' includes a plurality of core layers 110A and 110B. Components according to the present exemplary embodiments may be understood with reference to the description for the same or similar components of the semiconductor package 300 illustrated in FIGS. 6 and 7 unless explicitly described to the contrary.

The core substrate 100' used in the present exemplary embodiment may include first and second core layers 110A and 110B. The first and second core layers 110A and 110B may be coupled to an intermediate insulating layer 124 disposed therebetween. The core substrate 100' may include through-vias 123 penetrating through the first and second core layers 110A and 110B and the intermediate insulating layer 124. The first core layer 110A may include first and second cavities 110Ha and 110Hb, similar to the core substrate 110 illustrated in FIG. 6, and a plurality of passive components 125 may be mounted in the respective cavities 110Ha and 110Hb and may be electrically connected to a first wiring layer 115a.

In the exemplary embodiments described above, a form in which the core substrate includes the plurality of cavities is exemplified, but the core substrate may include a single cavity. In addition, the number of passive components mounted in the cavity is not limited to being plural, and may be one. The passive components and the semiconductor chips may also be mounted together in the same cavity.

As set forth above, according to an exemplary embodiment in the present disclosure, a portion of the interposer may be used as the core substrate and the passive component may be embedded in the core substrate, such that the passive component may be disposed in a region adjacent to the semiconductor chip. The core substrate may be used as the carrier in a process of manufacturing the interposer, such that the connection structure (that is, the redistribution layer) of the interposer may be formed without using a separate carrier.

While exemplary embodiments have been shown and described above, it will be apparent to those skilled in the art that modifications and variations could be made without departing from the scope of the present invention as defined by the appended claims.

What is claimed is:

1. A method of manufacturing a semiconductor package, the method comprising:
preparing a core substrate having an upper surface and a lower surface, and including at least one cavity;
disposing at least one passive component in the at least one cavity;
forming a first insulating layer on the upper surface of the core substrate and in the at least one cavity, the first insulating layer encapsulating the at least one passive component;
forming through-vias penetrating the core substrate and the first insulating layer, and a first wiring layer on the first insulating layer, the first wiring layer connecting the through-vias and the at least one passive component;
forming a connection structure including an insulating member on the first insulating layer and a redistribution layer in the insulating member, the redistribution layer connected to the first wiring layer; and
disposing at least one semiconductor chip on an upper surface of the connection structure, the at least one semiconductor chip having connection pads connected to the redistribution layer.

2. The method of claim 1, wherein the first wiring layer includes a first wiring pattern disposed on an upper surface of the first insulating layer and connected to the through-vias, and first connection vias penetrating through the first insulating layer and connected to the at least one passive component.

3. The method of claim 1, wherein the insulating member of the connection structure includes a photoimagable dielectric (PID) material, and the core substrate includes a non-PID material.

4. The method of claim 1, wherein the connection pads of the at least one semiconductor chip and the redistribution layer are connected to each other by first electrical connection metals.

5. The method of claim 1, further comprising an underfill resin disposed between the at least one semiconductor chip and the upper surface of the connection structure.

6. The method of claim 1, further comprising a first passivation layer disposed on the upper surface of the connection structure and having a plurality of openings exposing regions of the redistribution layer.

7. The method of claim 1, further comprising forming a second insulating layer on the lower surface of the core substrate; and forming a second wiring layer on a lower surface of the second insulating layer and connected to the through-vias.

8. The method of claim 7, wherein the second wiring layer includes a second wiring pattern disposed on the lower surface of the second insulating layer and connected to the through-vias and second connection vias penetrating through the second insulating layer and connected to the at least one passive component.

9. The method of claim 7, wherein the at least one cavity includes a first cavity and a second cavity.

10. The method of claim 9, wherein the at least one passive component includes a plurality of passive components disposed, respectively, in the first cavity and the second cavity.

11. The method of claim 9, further comprising an additional semiconductor chip accommodated in the second cavity and connected to at least one of the first wiring layer and the second wiring layer.

wherein the at least one passive component is disposed in the first cavity.

12. The method of claim 7, further comprising a second passivation layer disposed on the lower surface of the second insulating layer and having a plurality of openings exposing regions of the second wiring layer.

13. The method of claim 12, further comprising a plurality of electrical connection metals disposed on the second passivation layer and connected to the regions of the second wiring layer through the plurality of openings.

14. The method of claim 1, wherein the core substrate includes a plurality of core layers and an additional insulating layer disposed between the plurality of core layers.

15. The semiconductor package of claim 1, further comprising an encapsulant encapsulating the at least one semiconductor chip,
wherein upper surfaces of the at least one semiconductor chip and an upper surface of the encapsulant are substantially coplanar with each other.

16. A method of manufacturing a semiconductor package, the method comprising:
preparing a core substrate having an upper surface and a lower surface, and including at least one cavity;
disposing at least one electronic device in the at least one cavity;
forming a first insulating layer on the upper surface of the core substrate and in the at least one cavity, the first insulating layer encapsulating the at least one electronic device;
forming a second insulating layer on the lower surface of the core substrate;
forming through-vias penetrating the core substrate, the first insulating layer, and the second insulating layer, and a first wiring layer on the first insulating layer, the first wiring layer connecting the through-vias and the at least one electronic device;
forming a second wiring layer on a lower surface of the second insulating layer and connected to the through-vias;
forming a connection structure including an insulating member on the first insulating layer and a redistribution layer in the insulating member, the redistribution layer connected to the first wiring layer; and
disposing at least one semiconductor chip on an upper surface of the connection structure, the at least one semiconductor chip having connection pads connected to the redistribution layer.

17. The method of claim 16, wherein the least one electronic device includes an additional semiconductor chip.

18. The method of claim 16, wherein the at least one cavity includes a first cavity and a second cavity, and the least one electronic device includes an additional semiconductor chip disposed in the first cavity, and at least one passive component disposed in the second cavity.

19. The method of claim 16, wherein at least one of the first insulating layer and the second insulating layer includes a photoimagable dielectric (PID).

20. A method of manufacturing a semiconductor package, the method comprising:
preparing a core substrate having an upper surface and a lower surface, and including at least two cavities;
disposing a plurality of electronic devices in the at least two cavities;
forming a first insulating layer on the upper surface of the core substrate and in the at least two cavities, the first insulating layer encapsulating the plurality of electronic devices;
forming a second insulating layer on the lower surface of the core substrate;
forming through-vias penetrating the core substrate, the first insulating layer, and the second insulating layer, and a first wiring layer on the first insulating layer, the first wiring layer connecting the through-vias and the plurality of electronic devices;
forming a second wiring layer on a lower surface of the second insulating layer and connected to the through-vias;
forming a connection structure including an insulating member on the first insulating layer and a redistribution layer in the insulating member, the redistribution layer connected to the first wiring layer; and
disposing at least one semiconductor chip on an upper surface of the connection structure, the at least one semiconductor chip having connection pads connected to the redistribution layer,
wherein one of the at least two cavities overlaps with the at least one semiconductor chip, in a plan view, and
lower surfaces of the plurality of electronic devices and the lower surface of the core substrate are located at substantially the same level.

\* \* \* \* \*